(12) United States Patent
Fujimoto

(10) Patent No.: US 8,598,877 B2
(45) Date of Patent: Dec. 3, 2013

(54) SYSTEM AND METHOD FOR COIL DISABLING IN MAGNETIC RESONANCE IMAGING

(75) Inventor: Masahiro Fujimoto, Waukesha, WI (US)

(73) Assignee: General Electric Company, Schenectady, NY (US)

( * ) Notice: Subject to any disclaimer, the term of this patent is extended or adjusted under 35 U.S.C. 154(b) by 609 days.

(21) Appl. No.: 12/637,288

(22) Filed: Dec. 14, 2009

(65) Prior Publication Data

US 2011/0140699 A1    Jun. 16, 2011

(51) Int. Cl.
*G01R 33/34* (2006.01)

(52) U.S. Cl.
USPC ............ 324/318; 324/322; 600/410; 600/422

(58) Field of Classification Search
USPC .................... 324/300–322; 600/407–435; 382/128–131; 343/718; 335/299
See application file for complete search history.

(56) References Cited

U.S. PATENT DOCUMENTS

| | | | | |
|---|---|---|---|---|
| 4,602,234 A * | 7/1986 | Butson | ........................ | 335/299 |
| 4,833,409 A * | 5/1989 | Eash | ............... | 324/318 |
| 5,024,229 A * | 6/1991 | Bryant et al. | ................. | 600/422 |
| 5,128,686 A * | 7/1992 | Tan et al. | ....................... | 343/718 |
| 5,139,024 A * | 8/1992 | Bryant et al. | .................. | 600/422 |
| 5,194,811 A * | 3/1993 | Murphy-Boesch et al. | .. | 324/318 |
| 5,202,635 A * | 4/1993 | Srinivasan et al. | ............ | 324/322 |
| 5,440,214 A * | 8/1995 | Peeters | ......................... | 318/685 |
| 5,708,360 A * | 1/1998 | Yui et al. | ....................... | 324/318 |
| 5,751,146 A * | 5/1998 | Hrovat | .......................... | 324/318 |
| 6,020,740 A * | 2/2000 | Renz et al. | ..................... | 324/318 |
| 6,100,691 A * | 8/2000 | Yeung | .......................... | 324/318 |
| 6,504,369 B1* | 1/2003 | Varjo et al. | ..................... | 324/318 |
| 6,515,479 B1* | 2/2003 | Arz et al. | ...................... | 324/318 |
| 6,791,328 B1 | 9/2004 | Nabetani et al. | | |
| 6,842,003 B2* | 1/2005 | Heid et al. | .................... | 324/318 |
| 7,432,711 B2* | 10/2008 | Du et al. | ........................ | 324/318 |
| 7,545,144 B2* | 6/2009 | Guan et al. | ..................... | 324/318 |
| 7,701,216 B2* | 4/2010 | Du et al. | ........................ | 324/318 |
| 8,106,656 B2* | 1/2012 | Wosik et al. | .................... | 324/318 |
| 2003/0184298 A1* | 10/2003 | Heid et al. | .................... | 324/318 |
| 2007/0085634 A1* | 4/2007 | Du et al. | ..................... | 333/219.2 |
| 2008/0265891 A1* | 10/2008 | Du et al. | ........................ | 324/318 |
| 2009/0121715 A1* | 5/2009 | Guan et al. | ..................... | 324/318 |
| 2011/0124507 A1* | 5/2011 | Wosik et al. | .................... | 505/162 |
| 2011/0140699 A1* | 6/2011 | Fujimoto | ..................... | 324/318 |

* cited by examiner

*Primary Examiner* — Melissa Koval
*Assistant Examiner* — Tiffany Fetzner
(74) *Attorney, Agent, or Firm* — The Small Patent Law Group; Dean D. Small

(57) ABSTRACT

A system and method for coil disabling in magnetic resonance imaging are provided. One magnetic resonance coil includes a radio-frequency (RF) coil having end rings with a plurality of conductors connected therebetween and at least one loop coil positioned at one of the end rings. The one loop coil is configured to operate at a resonant frequency of the RF coil.

25 Claims, 10 Drawing Sheets

SYSTEM AND METHOD FOR COIL DISABLING IN MAGNETIC RESONANCE IMAGING

BACKGROUND OF THE INVENTION

The subject matter disclosed herein relates generally to magnetic resonance imaging systems, and more particularly to systems and methods for disabling coils in magnetic resonance imaging systems.

Magnetic Resonance Imaging (MRI) systems include a magnet, such as a superconducting magnet that generates a temporally constant (i.e., uniform and static) primary or main magnetic field. MRI data acquisition is accomplished by exciting magnetic moments within the primary magnetic field using magnetic gradient coils. For example, in order to image a region of interest, the magnetic gradient coils are energized to impose a magnetic gradient to the primary magnetic field. Transmit radio-frequency (RF) coils are then pulsed to create RF magnetic field pulses in a bore of an MRI scanner to selectively excite a volume corresponding to the region of interest in order to acquire MR images of the region of interest using receive RF coils. During the transmission of the RF magnetic field pulses, the receive RF coils are decoupled or disabled and during reception the transmit RF coils are decoupled or disabled. The resultant image that is generated shows the structure and function of the region of interest.

In conventional MRI systems, isolating the receive RF coils from the transmit field is provided using active and passive disabling or decoupling networks. For example, in birdcage type RF coils a large number of disabling circuits are needed to provide decoupling, with each typically having one or more high power diodes, for example, PIN diodes. These diodes are not only expensive, but easy to break. Depending on the placement of the diodes, detuning capacitors may be used, which degrades the uniformity of the birdcage coil. Additionally, more heating may result from large RF currents, which reduces reliability. Moreover, in multi-nuclear spectroscopy imaging wherein multiple coils are tuned to different resonant frequencies, additional disabling circuits are needed for each of the coils. In some of these multi-nuclear spectroscopy imaging systems the capacitive distribution is changed to provide disabling, but requires a system design change.

BRIEF DESCRIPTION OF THE INVENTION

In accordance with various embodiments, a magnetic resonance coil is provided that includes a radio-frequency (RF) coil having end rings with a plurality of conductors connected therebetween. The magnetic resonance coil further includes at least one loop coil positioned at one of the end rings. The one loop coil is configured to operate at a resonant frequency of the RF coil.

In accordance with other embodiments, a magnetic resonance coil is provided that includes a radio-frequency (RF) birdcage coil having end rings with a plurality of conductors connected therebetween and a plurality of disabling loop coils at one of the end rings. The magnetic resonance coil further includes a switching element connected to the plurality of disabling loop coils and configured to enable and disable operation of the plurality of disabling loop coils. The plurality of disabling loop coils are tuned to operate at a resonant frequency of the RF birdcage coil.

In accordance with yet other embodiments, a method of disabling a magnetic resonance (MR) radio-frequency (RF) coil is provided. The method includes providing a plurality of disabling loop coils in combination with the MR RF coil and configuring the plurality of disabling loop coils to operate at a resonant frequency of the MR RF coil to disable the MR RF coil.

DETAILED DESCRIPTION OF THE INVENTION

Figure 1:
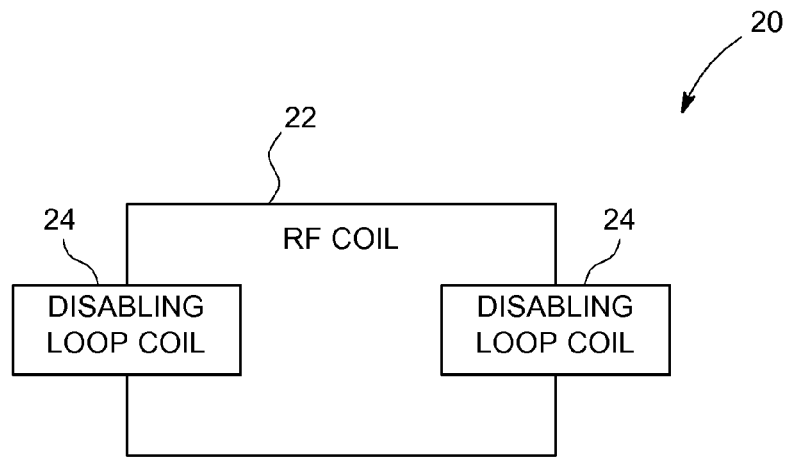
FIG. 1 is a simplified block diagram of coil arrangement with disabling coil loops formed in accordance with various embodiments.

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks may be implemented in a single piece of hardware or multiple pieces of hardware. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide systems and methods for coil disabling in magnetic resonance imaging (MRI) systems. In particular, a radio-frequency (RF) coil of the MRI system, such as a birdcage coil is disabled using one or more resonant loop coils. The one or more loop coils may be positioned along the end rings of the birdcage coil as described in more detail below. A reduced number of disabling circuits, which do not required diodes, is realized by the practice of some embodiments of the described systems and techniques.

Specifically, as shown in FIG. 1, a coil arrangement 20 is provided that allows for a magnetic resonance (MR) coil to be disabled. For example, if an MR surface coil is receiving MR signals from a patient being imaged, an RF coil formed in accordance with various embodiments is disabled using one or more loop coils.

The coil arrangement 20 includes an RF coil 22, which in some embodiments is an RF body coil, such as a birdcage type coil. The coil arrangement 20 also includes one or more disabling components, which are illustrated as disabling loop coils 24 coupled to ends of the RF coil 22, for example, adjacent or abutting one or more of the ends of the RF coil 22. It should be noted that the disabling loop coils 24 are not electrically or circuit connected the RF coil 22. For example, the disabling loop coils 24 may be positioned such that the disabling loop coils 24 are supported on or adjacent the ends of the RF coil 22. The position of the disabling loop coils 24 relative to the ends of the RF coil 22 may be maintained using a former that houses the disabling loop coils 24 and the coil elements forming the RF coil 22 as described in more detail herein.

The disabling loop coils 24 are configured to detune or decouple the RF coil 22. For example, if the RF coil 22 is a transmit body coil, during receive operation, when surface coils (not shown) are receiving MR signals from a patient being imaged, the RF coil 22 is disabled by the disabling loop coils 24 such that the RF coil 22 is detuned or decoupled from the surface coils.

In the various embodiments, the disabling loop coils 24 are configured as resonant loop coils that resonate at the frequency of the RF coil 22. It should be noted that the number of disabling loop coils 24 may be varied. For example, although two, four or more disabling loop coils 24 may be described, additional or fewer loop coils may be provided. Also, although the disabling loop coils 24 may be described in pairs, such a configuration is not necessary. The positioning of the disabling loop coils 24 along the RF coil 22 also may be varied as desired or needed, for example, based on tuning requirements. As an example, in a birdcage type coil application, four disabling loop coils 24 may be provided along end rings of the RF coil 22 with the length of each of disabling loop coils 24 about one quarter of the circumference of an end ring. The disabling loop coils 24 are tuned at the frequency of the birdcage uniform mode to detune or decouple to the RF coil 22, such as during receive operation of an MRI system. Thus, in various embodiments, the disabling loop coils 24 have a total length of a circumference of one of the ends of the RF coil 22, for example, an end ring of a birdcage coil as described in more detail below.

Figure 2:
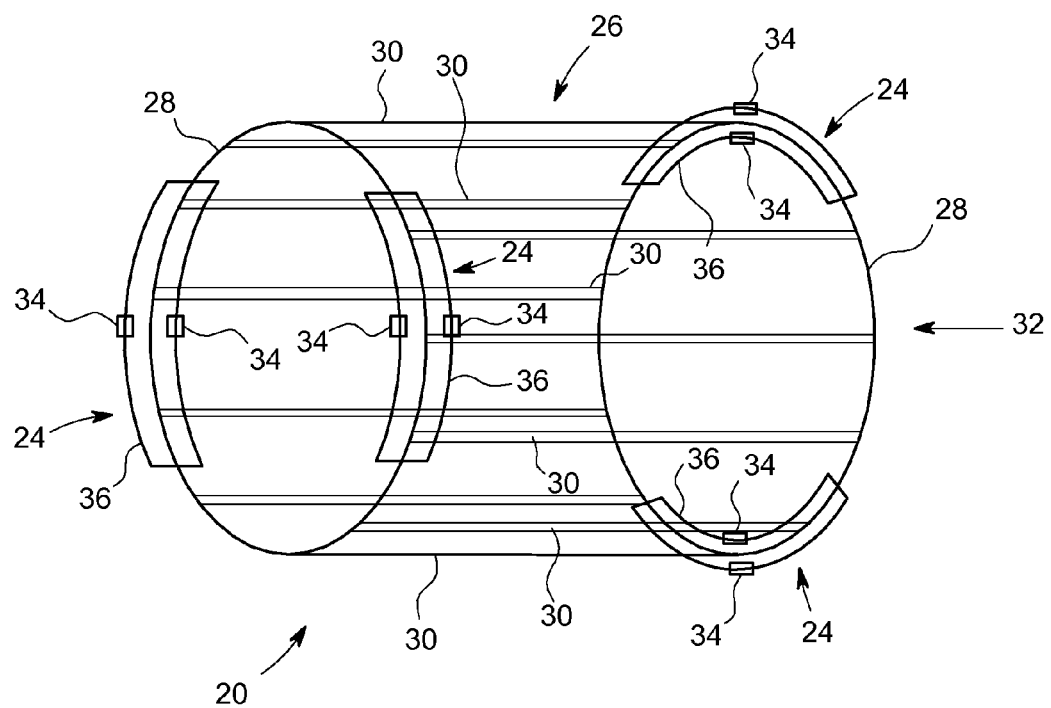
FIG. 2 is a perspective view of a birdcage coil with disabling coil loops formed in accordance with various embodiments.

As shown in FIG. 2, in various embodiments the coil arrangement 20 includes a birdcage coil 26, which is an exemplary RF coil that can be used for MRI imaging. The birdcage coil 26 includes two conductive end rings 28 that define conductive end loops with a plurality of conductors 30 connected electrically therebetween to each of the end rings 28. The plurality of conductors 30 are arranged in a substantially cylindrical shape around an axis that defines a patient examination bore 32, thereby forming the birdcage coil 26. Each of the end rings 28 with each of the conductors 30 therebetween define a substantially cylindrical imaging volume into which an object, such as a patient is inserted such that the object is subjected to an RF field generated by the birdcage coil 26. It should be noted that one or more capacitors (not shown for simplicity) may be connected to the each of the end rings 28, which may be low inductance end ring capacitors that are serially coupled to the conductors 30 and electrically interconnect the conductors 30 to the end rings 28.

The coil arrangement 20 with the birdcage coil 26 also includes a plurality of disabling components, which in the illustrated embodiment are the disabling loop coils 24, which each include one or more capacitors 34. Each of the disabling loop coils 24 is configured as a separate conductive loop coil 36 that is coupled to one of the two end rings 28, and in particular, along one of the two end rings 28. The conductive loop coil 36 extend along the circumference of the end ring 28, which in some embodiments include a length of the conductive loop coil 36 being generally perpendicular to the conductors 30. As illustrated, the disabling loop coils 24 are provided as opposing conductive loop coils 36 having a curved shape to, for example, surround or extend along a portion of circumference of one or more of the end rings 28. A length of the disabling loop coils 24 generally extends along one or more of the end rings 28 in a direction perpendicular to the conductors 30.

Each of the separate conductive loop coils 36 includes the one or more capacitors 34 coupled along the coil thereof. The one or more capacitors 34 tune the disabling loop coils 24 to operate at a resonant frequency of the birdcage coil 26 as described in more detail herein.

Figure 3:
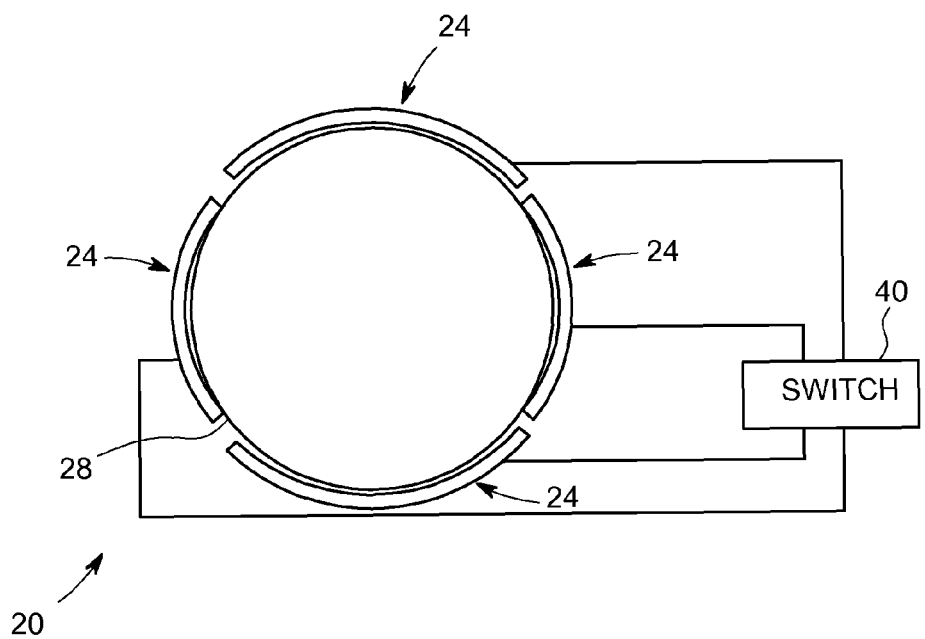
FIG. 3 is a side elevation view of the birdcage coil of FIG. 2.
Figure 4:
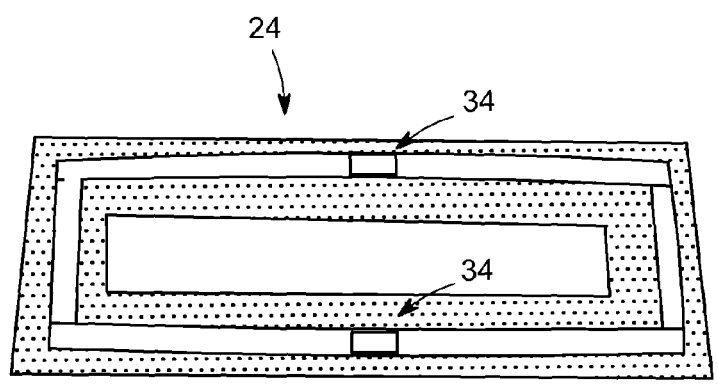
FIG. 4 is a top plan view of a disabling coil loop formed in accordance with various embodiments.
Figure 5:
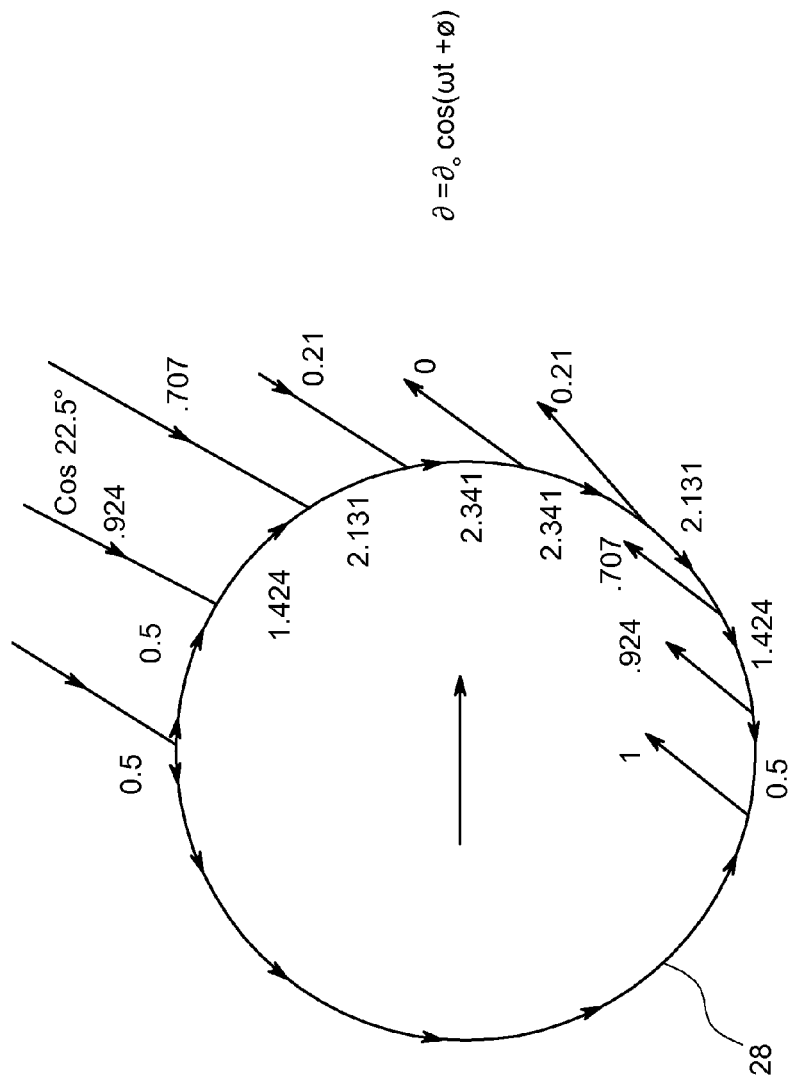
FIG. 5 is a diagram illustrating a wave distribution through the end rings of uniform mode of a birdcage coil formed in accordance with various embodiments.

In the illustrated embodiment, a pair of disabling loop coils 24 (which may be in an opposed relation) are provided on each of the end rings 28. Each of the disabling loop coils 24, as shown in FIG. 3, is dimensioned such that a length of each of the disabling loop coils 24 is about one quarter of the circumference of the respective end ring 28. As described in more detail herein, the capacitors 34, as shown in FIG. 4, are provided to tune the disabling loop coils 24 at the frequency of the birdcage uniform mode. Thus, the disabling loop coils 24 are tuned by the capacitors 34 to resonate at the frequency of the birdcage coil 26. Because the current flowing through end rings 28 has a one wave distribution through the end rings 28, as illustrated in FIG. 5, having four quarter-circle length disabling loop coils 24 along the end rings 28, coil disabling in all directions is provided. It should be noted that the disabling loop coils 24 may be provided in pairs on different end rings 28 (as illustrated in FIG. 2) or optionally may be provided on the same end ring 28.

In accordance with various embodiments, the disabling loop coils 24 are configured for switchable operation, which may thereby define dynamic disabling loops. In particular, a switching element, illustrated as a switch 40, is provided in connection with the disabling loop coils 24. It should be noted that although a single switch 40 is shown for controlling the disabling operation of all the disabling loop coils 24, separate switches 40 may be provided, for example, in connection with each pair of disabling loop coils 24, such as for each pair of disabling loop coils 24 on each of the end rings 28. It should be noted that the switch 40 may be any type of switching or biasing element as described in more detail herein.

Figure 6:
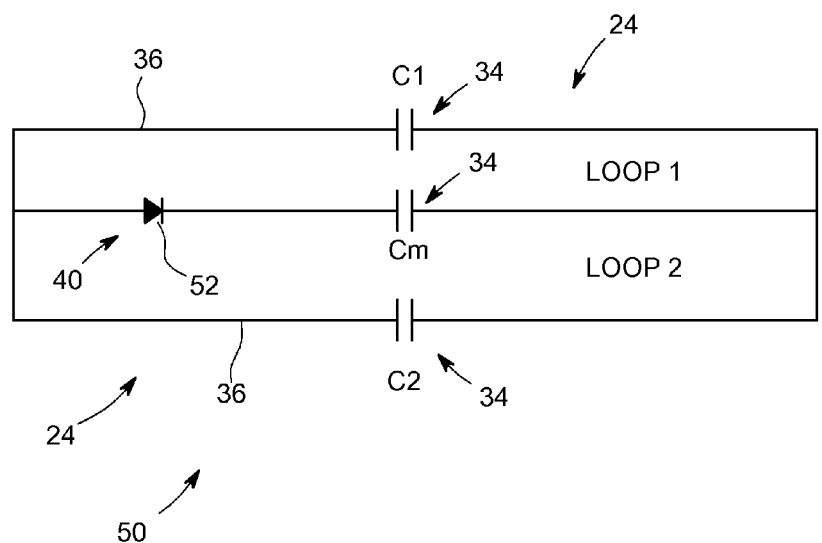
FIG. 6 is a schematic diagram representing disabling coil loops formed in accordance with various embodiments.

Referring now to each pair of disabling loop coils 24, the pairs of disabling loop coils 24 each include the conductive loop coils 36 that are isolated using the capacitors 34, which are configured as mutual inductance cancel capacitors. In some embodiments, a separate switch 40 is provided for each pair of disabling loop coils 24 connected to each of the conductive loop coils 36 of that pair of disabling loop coils 24. Thus, as shown in FIG. 6, a pair of disabling loop coils 24 in various embodiments forms a disabling unit 50, which includes the conductive loop coils 36 for each of the pair of disabling loop coils 24. In the illustrated embodiment, the switch 40 is a diode 52 connected between the conductive loop coils 36. Thus, the diode 52 is shared by the two conductive loop coils 36. It should be noted that in FIG. 6, the bias circuit that biases the diode 52 to provide the disabling operation of the pair of disabling loop coils 24 (by turning on and off the diode 52) is not shown, but may be provided in any suitable manner, for example, using a voltage or current source.

Accordingly, in operation, depending on the biasing of the diode 52, the pair of disabling loop coils 24 may operate (or appear) as two separate loops, namely the conductive loop coils 36, or a single larger loop coil formed from the combination of the conductive loop coils 36. When the pair of disabling loop coils 24 operates a single larger loop coil, the pair of disabling loop coils 24 are operating in an enable mode such that the birdcage coil 26 is enabled, for example, in a transmit mode of operation of the MRI system. When the pair of disabling loop coils 24 operates as two loops, the pair of disabling loop coils 24 are operating in a disable mode such that the birdcage coil 26 is disabled, for example, in a receive mode of operation of the MRI system. Thus, when the diode 52 is on (biased state), the conductive loop coils 36 operate independently. When the diode is off (unbiased state), the conductive loop coils 36 operate together as a single larger loop coil. It should be noted that the single larger loop coil is not necessarily twice the size of each of the conductive loop coils 36.

Figure 7:
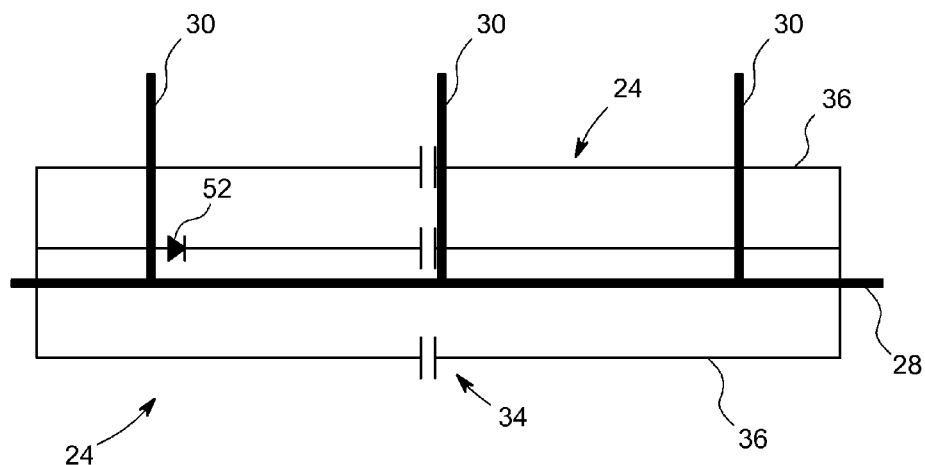
FIG. 7 is a diagram illustrating operation of disabling coil loops formed in accordance with various embodiments.

As illustrated in FIG. 7, when the diode 52 is off, the larger single loop coil mode is not seen by the birdcage coil 26 such that the birdcage coil 26 is enabled. It should be noted that the flux from the birdcage coil 26 is canceled in the larger single loop coil mode such that no (or minimal) voltage is induced in the conductive loop coils 36. Thus, when the birdcage coil 26 is enabled, such that transmit coil operation is enabled, no (or minimal) voltage is induced on the conductive loop coils 36, such that there is no interaction or reduced interaction with the birdcage coil 26. As also illustrated in FIG. 6, the two conductive loop coils 36 are isolated by a cancel capacitor (Cm), which provides mutual inductance canceling.

Continuing with the illustrated embodiment of FIG. 7, when the diode 52 is on, the conductive loop coils 36 couple with the birdcage coil 26 such that the birdcage coil 26 is disabled.

Figure 8:
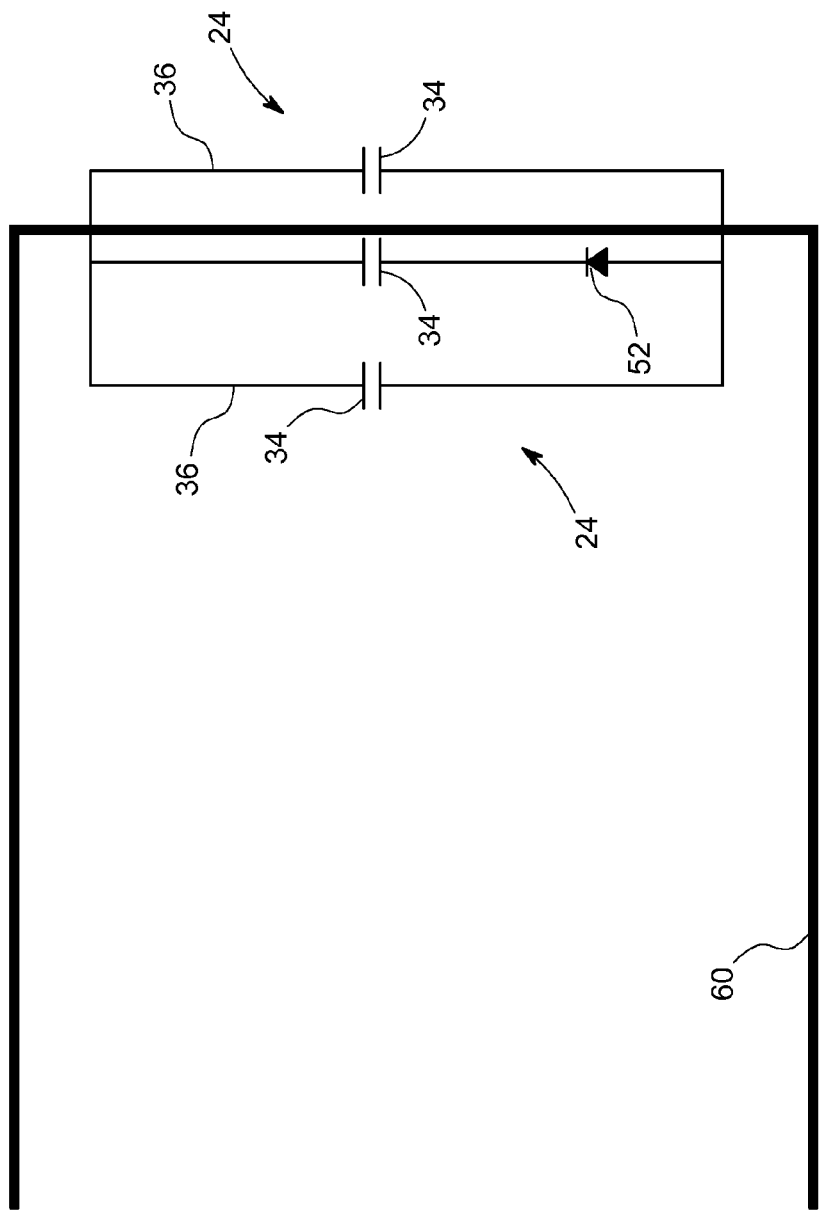
FIG. 8 is a schematic diagram of a multi-nuclear spectroscopy (MNS) coil having disabling coil loops formed in accordance with various embodiments.

It should be noted that the various embodiments may be implemented in connection with different types of coils to provide disabling operation, for example, any type of transmit/receive coils for an MRI system, which may be single coils or coil arrays. For example, as shown in FIG. 8, the various embodiments may be implemented in connection with coils for a multi-nuclear spectroscopy (MNS) imaging system that uses coils tuned at different resonant frequencies. In general, the frequency of each of the nuclei is lower than that for hydrogen (1H), which is normally used for MR imaging. Thus, as shown in FIG. 8, the disabling loop coils 24 may be provided in combination with an MNS coil 60. Thus, the disabling loop coils 24, and in particular, the capacitors 34 are provided to tune the conductive loop coils 36 to the resonant frequency of protons. However, the disabling loop coils 24 that are placed on or adjacent the end rings resonate at different frequencies. In the various embodiments, the disabling loop coils 24 decouple the body coil, for example, the birdcage coil 26 (shown in FIG. 2) from the MNS coil 60 by providing the disabling loop coils 24 in with the MNS coil 60.

It should be noted that in the various embodiments implemented for MNS imaging, the RF coils are typically transmit/receive coils, which is used in an MRI system that includes, for example, a body coil configured to be disabled at the 1H frequency for hydrogen nuclei. The various embodiments provide disabling operation at the MNS frequency for the MNS coil (instead of, for example, the 1H frequency for hydrogen nuclei). In the various embodiments, the body coil is disabled during both transmit and receive, such that the disabling and/or detuning does not have to include switching operation as described in connection with other embodiments herein. In particular, both of the MNS configured coil and the detuning loop, for example, the disabling loop coils 24 are resonant at the same frequency and which are isolated from each other by any suitable method, such as known in the art.

Figure 9:
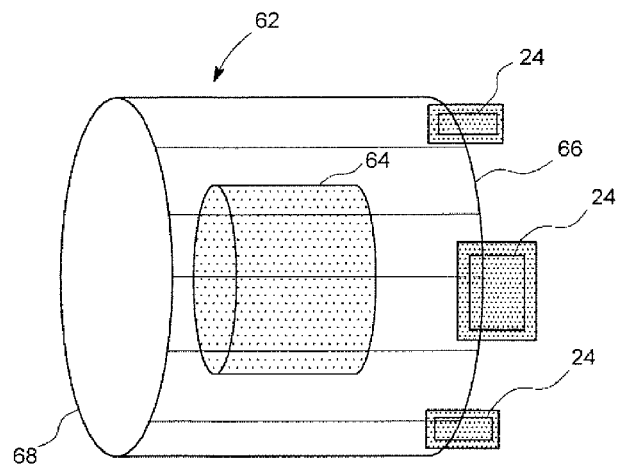
FIG. 9 is a diagram of an MNS coil arrangement with disabling coil loops formed in accordance with various embodiments.

Accordingly, as shown in FIG. 9 a body coil, configured as a birdcage coil 62 (similar to the birdcage coil 26 of FIG. 2) may be tuned at 64 MHz for 1H (Hydrogen) operation for a 1.5 Tesla (T) MRI system. Additionally, an MNS coil 64 is provided, for example, within the birdcage coil 62 and may be tuned at 48 MHz for 3He (Helium) operation for the 1.5 T MRI system. In the illustrated embodiment, a plurality of disabling loop coils 24 are coupled to an end ring 66 of the birdcage coil 62. It should be noted that more or less disabling loop coils 24 may be provided and positioned differently along the end ring 66 or on an opposite end ring 68. The disabling loop coils 24 are tuned at the MNS frequency, namely to resonate at 48 MHz. Thus, in this embodiment, no switches (e.g., no PIN diodes) are provided such that the disabling loop coils 24 are always on.

Figure 10:
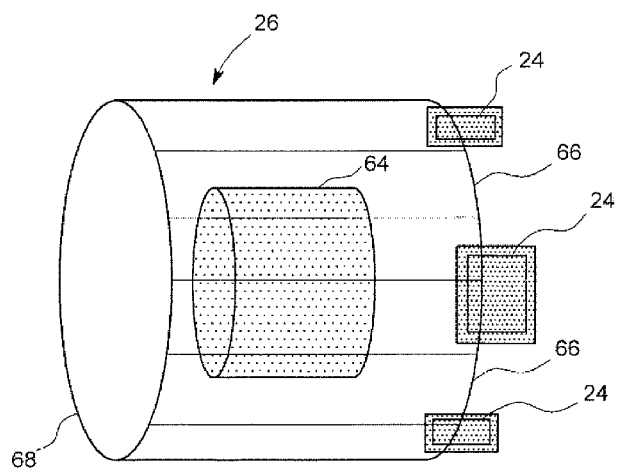
FIG. 10 is a diagram illustrating a configuration for the disabling coil loops in an MNS arrangement formed in accordance with various embodiments.
Figure 11:
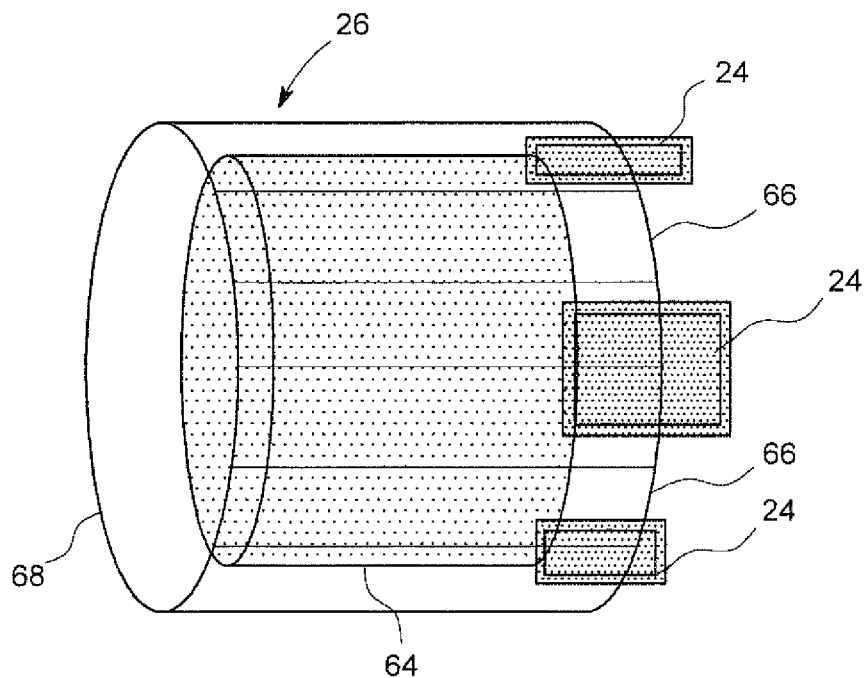
FIG. 11 is a diagram illustrating another configuration for the disabling coil loops in an MNS arrangement formed in accordance with various embodiments.
Figure 12:
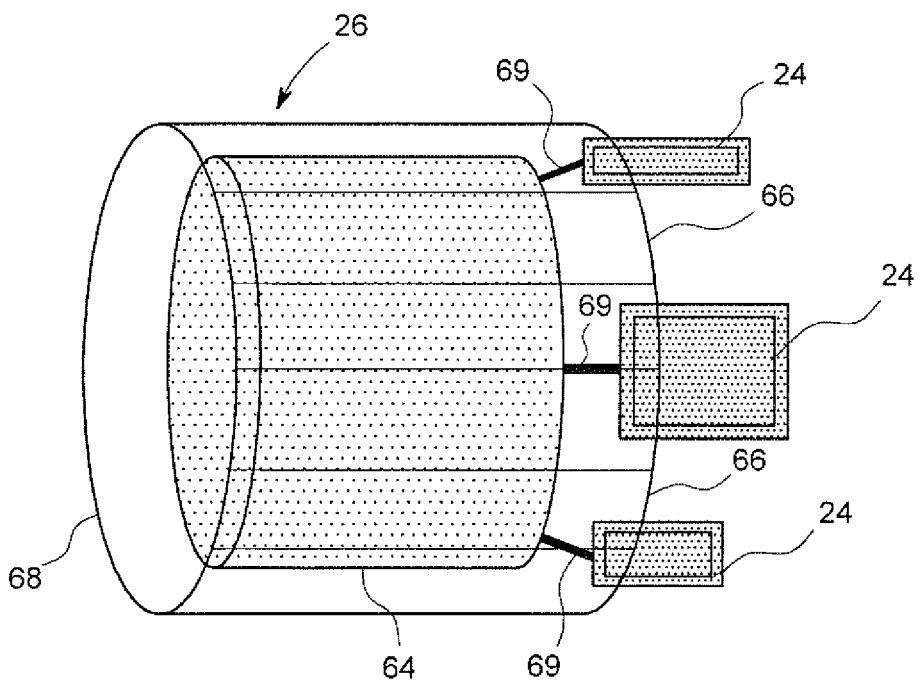
FIG. 12 is a diagram illustrating another configuration for the disabling coil loops in an MNS arrangement formed in accordance with various embodiments.

Additionally, it should be noted that the disabling loop coils 24 are isolated from the MNS coil 64 by, for example, suitable positioning of the disabling loop coils 24 or a coupling cancel circuit. The disabling loop coils 24 are, thus, configured to interact with the birdcage coil 62. For example, as shown in FIG. 10, the disabling loop coils 24 are positioned a distance away from the MNS coil 64, but close to the birdcage coil 62. As another example, as shown in FIG. 11, the disabling loop coils 24 are isolated from the MNS coil 64, but couple to the birdcage coil 62. As still another example, as shown in FIG. 12, the disabling loop coils 24 are connected to the MNS coil 64 with mutual inductance cancel circuits 69.

It should be noted that the disabling loop coils 24 in various embodiments do not need circuit connections with the RF coil, for example, the birdcage coil 26 (shown in FIG. 2). Accordingly, the disabling loop coils 24 may be provided, for example, on the bore of the MRI system.

Figure 13:
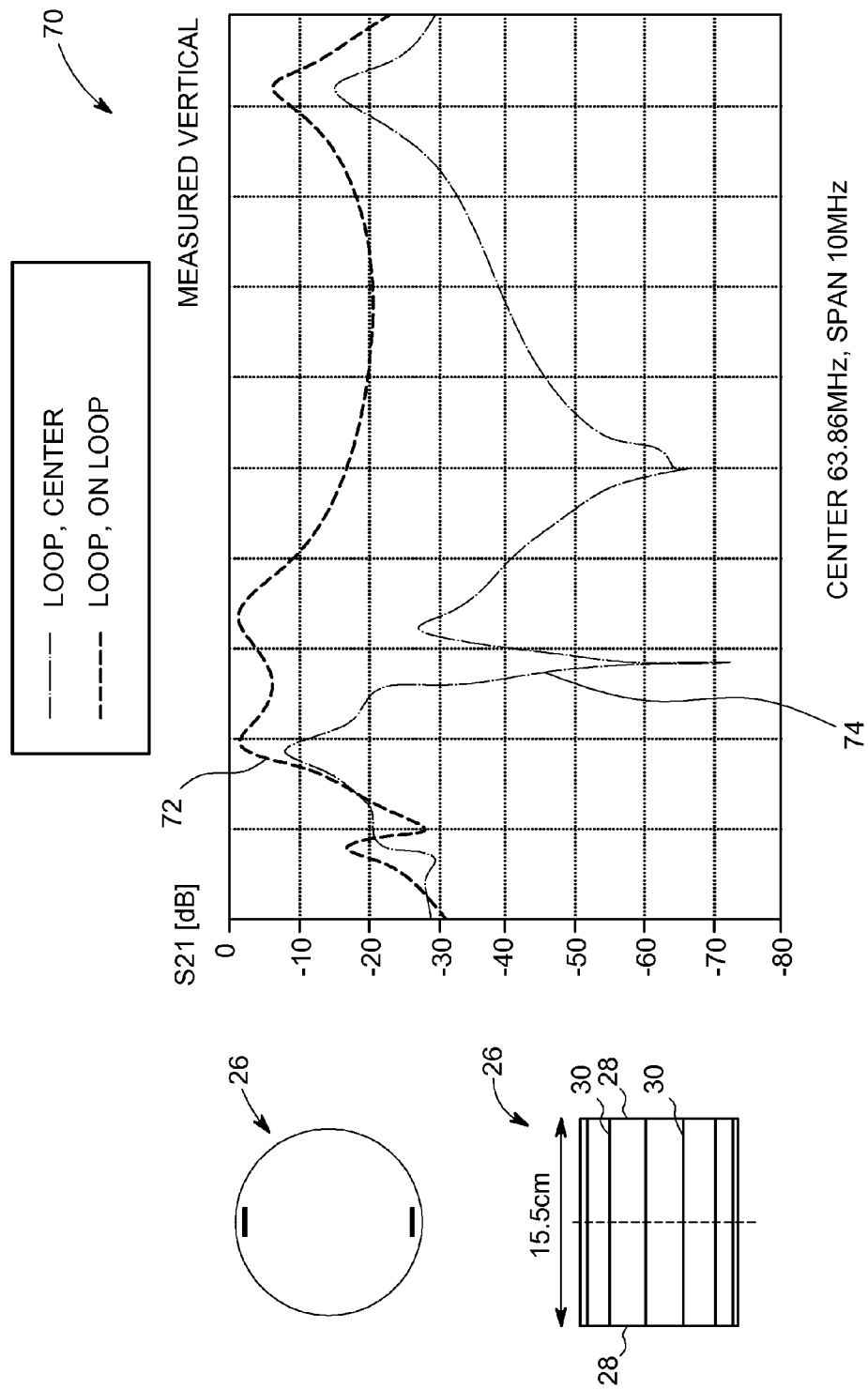
FIG. 13 is a graph illustrating decoupling operation in accordance with various embodiments.

Decoupling operation of the various embodiments is illustrated in the graph 70 of FIG. 13, which is for a birdcage coil implementation. For the graph 70, the birdcage coil was tuned at 63.86 MHz with −8 dB S21 peak for the tuning mode. As can be seen from the plots 72 and 74, disabling operation (subtraction of S21 at disable mode from tuning mode) was better than 40 dB at any locations within the birdcage coil. Disabling operation at the loop coils show 8 dB. It should be noted that in general the surface coil is not positioned in a region out of the imaging field of view (FOV). In the illustrated example, the Q of the birdcage coil does not degrade more than 5% with "disabled loop coils", compared to without the loop coils.

Figure 14:
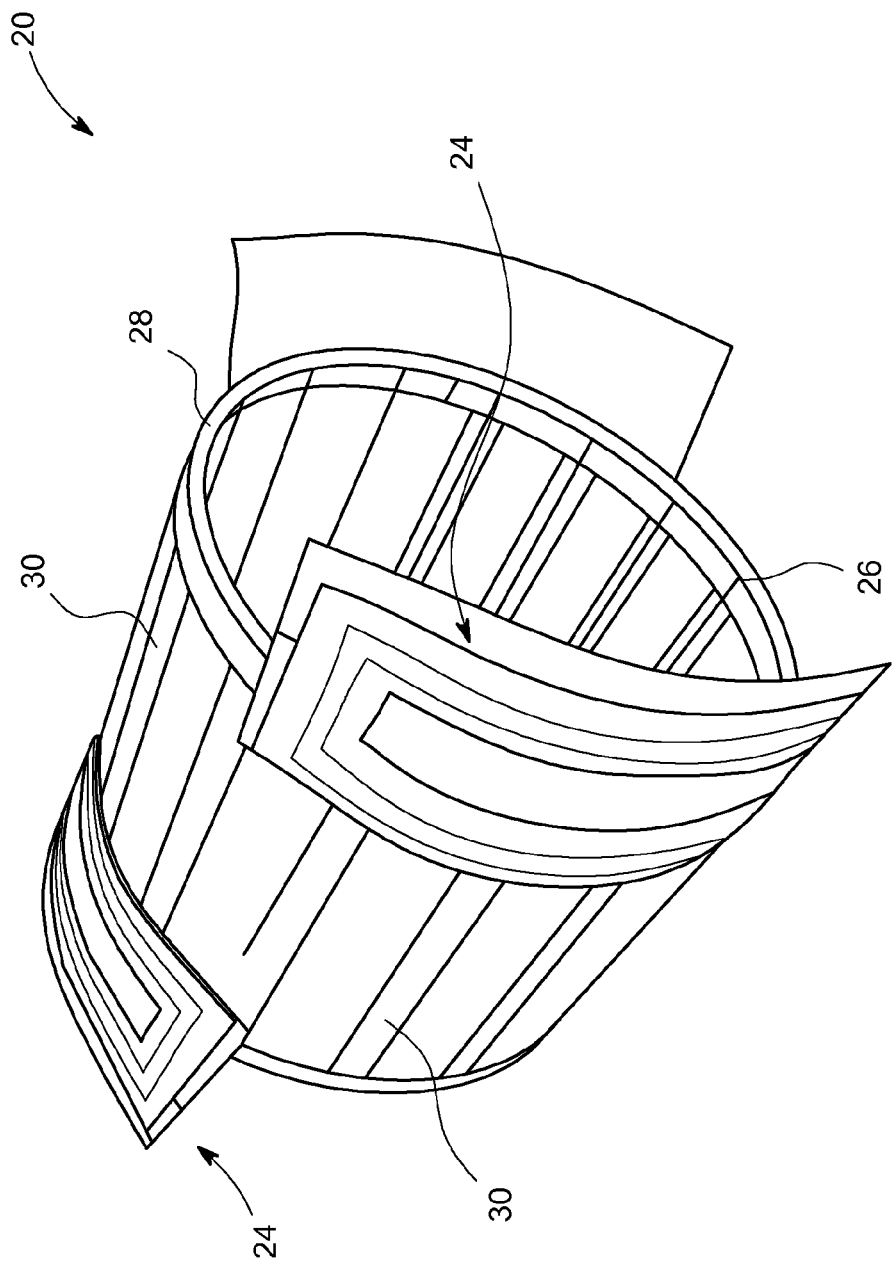
FIG. 14 is a perspective view of a birdcage coil with disabling coil loops formed in accordance with various embodiments.

Thus, various embodiments provide disabling loop coils for detuning or decoupling an RF coil, for example, a birdcage coil from surface coils of an MRI system as shown in FIG. 14. The detuning is provided without circuit connection to the RF coil.

The various embodiments may be implemented in connection with different types of RF magnetic resonance coils, which may be different types of magnetic resonance RF or surface coils operating at one or more frequencies. The various embodiments may be implemented in connection with MR coils for imaging in different types of MRI systems. For example, the various embodiments may be implemented with MR coils for use with the MRI system 100 shown in FIG. 15. It should be appreciated that although the imaging system 100 is illustrated as a single modality imaging system, the various embodiments may be implemented in or with multi-modality imaging systems. The imaging system 100 is illustrated as an MRI imaging system and may be combined with different types of medical imaging systems, such as a Computed Tomography (CT), Positron Emission Tomography (PET), a Single Photon Emission Computed Tomography (SPECT), as well as an ultrasound system, or any other system capable of generating images, particularly of a human. Moreover, the various embodiments are not limited to medical imaging systems for imaging human subjects, but may include veterinary or non-medical systems for imaging non-human objects, luggage, etc.

Figure 15:
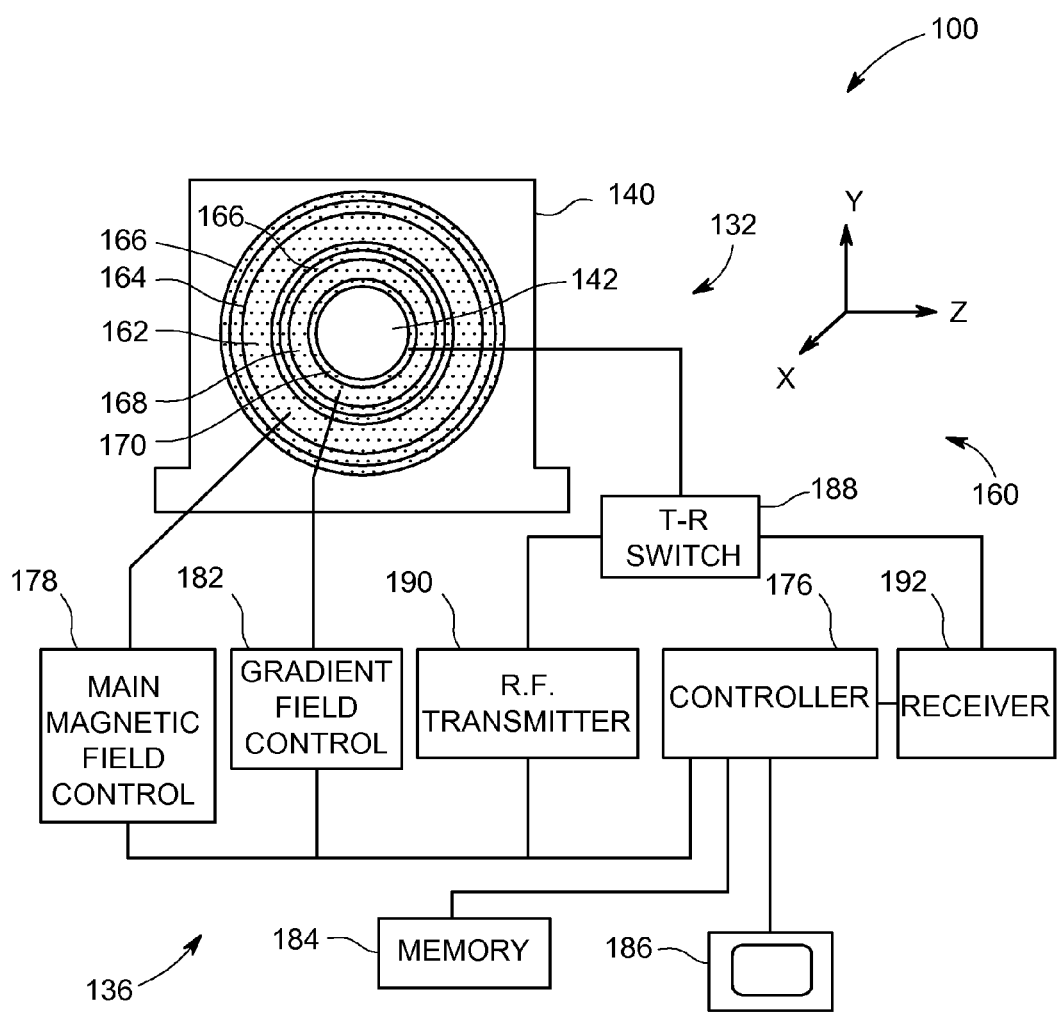
FIG. 15 is a pictorial view of a magnetic resonance imaging (MRI) system in which disabling coil loops formed in accordance with various embodiments may be implemented.

Referring to FIG. 15, the MRI system 100 generally includes an imaging portion 132 and a processing portion 136 that may include a processor or other computing or controller device. The MRI system 100 includes within a gantry 140 a superconducting magnet 162 formed from magnetic coils supported on a magnet coil support structure. However, in other embodiments, different types of magnets may be used, such as permanent magnets or electromagnets. A vessel 164 (also referred to as a cryostat) surrounds the superconducting magnet 162 and is filled with liquid helium to cool the coils of the superconducting magnet 162. Thermal insulation 166 is provided surrounding the outer surface of the vessel 164 and the inner surface of the superconducting magnet 162. A plurality of magnetic gradient coils 168 are provided within the superconducting magnet 162 and an RF transmit coil 170 is provided within the plurality of magnetic gradient coils 168. In some embodiments the RF transmit coil 170 may be replaced with a transmit and receive coil as described in more detail herein. The components within the gantry 140 generally form the imaging portion 132. It should be noted that although the superconducting magnet 162 is a cylindrical shaped, other shapes of magnets can be used.

The processing portion 136 generally includes a controller 156, a main magnetic field control 178, a gradient field control 182, a memory 184, a display device 186, a transmit-receive (T-R) switch 188, an RF transmitter 190 and a receiver 192.

Figure 16:
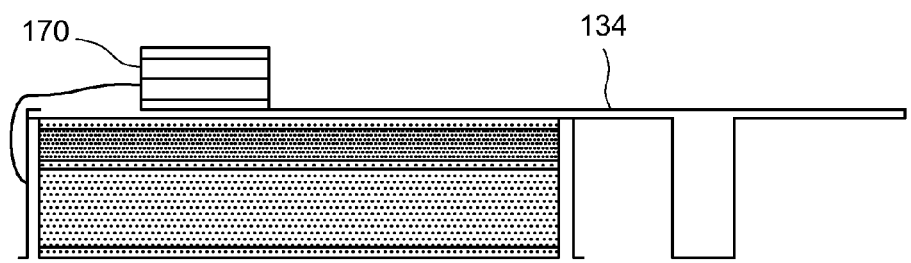
FIG. 16 is a side elevation view of a patient table and a body part specific transmit coil that may be used with the MRI system of FIG. 15.

In operation, a body of an object, such as a patient or a phantom to be imaged, is placed in the bore 142 on a suitable support, for example, a patient table 134 (shown in FIG. 16). The superconducting magnet 162 produces a uniform and static main magnetic field $B_o$ across the bore 142. The strength of the electromagnetic field in the bore 142 and correspondingly in the patient, is controlled by the controller 176 via the main magnetic field control 178, which also controls a supply of energizing current to the superconducting magnet 162.

The magnetic gradient coils 168, which include one or more gradient coil elements, are provided so that a magnetic gradient can be imposed on the magnetic field $B_o$ in the bore 142 within the superconducting magnet 162 in any one or more of three orthogonal directions x, y, and z. The magnetic gradient coils 168 are energized by the gradient field control 182 and are also controlled by the controller 176.

The RF transmit coil 170, which may include a plurality of coils, is arranged to transmit magnetic pulses and/or optionally simultaneously detect MR signals from the patient if receive coil elements are also provided, such as a surface coil configured as an RF receive coil. The RF receive coil may be of any type or configuration, for example, a separate receive surface coil. As illustrated in FIG. 16, the RF transmit coil 170 is a body coil, such as a birdcage type coil. The receive surface coil may be an array of RF coils (not shown in FIG. 15) provided within the RF transmit coil 170. The RF transmit coil 170 is detuned or decoupled from the receive surface coil(s) using the various embodiments. Thus, the RF transmit coil 170 configured as a body part specific coil, may be combined with the receive surface coil.

The RF transmit coil 170 and the receive surface coil are selectably interconnected to one of the RF transmitter 190 or receiver 192, respectively, by the T-R switch 188. The RF transmitter 190 and T-R switch 88 are controlled by the controller 176 such that RF field pulses or signals are generated by the RF transmitter 190 and selectively applied to the patient for excitation of magnetic resonance in the patient. While the RF excitation pulses are being applied to the patient, the T-R switch 188 is also actuated to disconnect the receive surface coil from the receiver 192.

Following application of the RF pulses, the T-R switch 188 is again actuated to disconnect the RF transmit coil 170 from the RF transmitter 190 and to connect the receive surface coil to the receiver 192. The receive surface coil operate to detect or sense the MR signals resulting from the excited nuclei in the patient and communicates the MR signals to the receiver 192. These detected MR signals are in turn communicated to the controller 176. The controller 176 includes a processor (e.g., image reconstruction processor), for example, that controls the processing of the MR signals to produce signals representative of an image of the patient.

The processed signals representative of the image are also transmitted to the display device 186 to provide a visual display of the image. Specifically, the MR signals fill or form a k-space that is Fourier transformed to obtain a viewable image. The processed signals representative of the image are then transmitted to the display device 186.

In various embodiments, the RF transmitter 190 is configured to generate at one or more resonate frequencies, for example, centered about the Larmor frequencies of proton (hydrogen nuclei) and/or carbon (e.g., $^{13}C$ nuclei). However, it should be noted that the RF transmitter 190 may be configured to generate other frequencies causing different nuclei to resonate at their Larmor frequencies. Moreover, the MR signals and the image(s) generated may be encoded using any known technique in the art.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A magnetic resonance coil comprising:
   a radio-frequency (RF) coil having end rings with a plurality of conductors connected there between; and
   a plurality of disabling loop coils, separate from and coupled, to one of the end rings of the RF coil, without any circuit connections, between the plurality of the disabling loop coils, and the RF coil;
   the plurality of disabling loop coils, extending beyond and outside of the extent of the one end ring, while also being positioned along the one end ring, in a non-overlapping arrangement to one another; and
   the plurality of disabling loop coils being configured to operate at a resonant frequency of the RF coil.

2. A magnetic resonance coil in accordance with claim 1 wherein the plurality of disabling loop coils extend along, beyond and outside of, the extent of a portion of a circumference of the one end ring.

3. A magnetic resonance coil in accordance with claim 1 wherein the plurality of disabling loop coils comprise at least a pair of disabling loop coils spaced apart and each extending beyond and outside of, the extent of, the one end ring while also being positioned along a portion of a circumference of the end ring.

4. A magnetic resonance coil in accordance with claim 1 wherein the plurality of disabling loop coils are configured having a one wave distribution through the end rings.

5. A magnetic resonance coil in accordance with claim 1 wherein the plurality of disabling loop coils together extend along substantially all of a circumference of one end ring in a non-overlapping arrangement to one another.

6. A magnetic resonance coil in accordance with claim 1 wherein the plurality of disabling loop coils comprise a plurality of disabling loop coils positioned on each of the end rings in a non-overlapping arrangement to one another.

7. A magnetic resonance coil in accordance with claim 6 the plurality of disabling loop coils comprises pairs of disabling loop coils positioned in a non-overlapping arrangement to one of the end rings.

8. A magnetic resonance coil in accordance with claim 1 comprising a pair of opposing disabling loop coils positioned on each of the end rings at a different radial position of the RF coil.

9. A magnetic resonance coil in accordance with claim 1 further comprising: a former that houses the plurality of loop coils in order to maintain the position of the plurality of loop coils relative to the end ring.

10. A magnetic resonance coil in accordance with claim 1 wherein the RF coil is configured as a birdcage coil.

11. A magnetic resonance coil in accordance with claim 1 wherein at least one capacitor is connected to at least one of the plurality of disabling loop coils and configured to tune the at least one connected disabling loop coil to a resonant frequency of the RF coil.

12. A magnetic resonance coil in accordance with claim 1 further comprising a switch configured to switch between an enable mode and a disable mode of the plurality of disabling loop coils.

13. A magnetic resonance coil in accordance with claim 12 wherein the plurality of disabling loop coils comprise two disabling loop coils and wherein the switch is configured to operate the two disabling loop coils either together or separately when the switch is utilized.

14. A magnetic resonance coil in accordance with claim 1 wherein the plurality of disabling loop coils is provided on a support structure and the plane of the support structure is perpendicular to a plane defined by the end ring.

15. A magnetic resonance coil in accordance with claim 1 wherein the plurality of disabling loop coils are conductive coils that are not electrically connected to the RF coil.

16. A magnetic resonance coil in accordance with claim 1 wherein the plurality of disabling loop coils comprise at least a pair of disabling loop coils positioned at each of the end rings, each of the pair of disabling loop coils at each of the end rings being spaced apart from one another and extending along, beyond, and outside of the extent of each of the end rings while having a portion, which overlaps a circumferential portion, defined by at least the pair of disabling loop coils positioned at the other end ring the pair of disabling loop coils, positioned on each end ring being spaced apart 180 degrees relative to each other; and the pair of disabling loop coils positioned on one end ring being shifted 90 degrees with respect to the pair of disabling loop coils positioned on the other end ring.

17. A magnetic resonance coil in accordance with claim 1 wherein the plurality of disabling loop coils comprise at least a pair of disabling loop coils positioned at each of the end rings, each of the pair of loop coils being spaced apart and extending along and overlapping a portion of a circumference of a respective one of the end rings, a plane of one of the pair of disabling loops coils on each of the end rings not overlapping a plane of the other one of the pair of disabling loop coils on the respective end ring, wherein each of the pairs of disabling loop coils not being electrically interconnected with the respective one of the end rings.

18. A magnetic resonance coil in accordance with claim 17, wherein each of the pairs of disabling loop coils having a middle axis of each of the loop coils aligned along a respective end ring.

19. A magnetic resonance coil comprising:
   a radio-frequency (RF) birdcage coil having end rings with a plurality of conductors connected there between;
   a plurality of disabling loop coils separate from and coupled to one of the end rings of the RF coil, without any circuit connections, between the plurality of the disabling loop coils, and the RF coil;

the plurality of disabling loop coils, extending beyond and outside of, the extent of the one end ring, and also being positioned along the one end ring, in a non-overlapping arrangement to one another; and a switching element connected to the plurality of disabling loop coils, and configured to enable and disable operation of the plurality of disabling loop coils, wherein the plurality of disabling loop coils, are tuned to operate at a resonant frequency of the RF birdcage coil.

20. A magnetic resonance coil in accordance with claim 19 wherein the switching element comprises a single diode.

21. A magnetic resonance coil in accordance with claim 19 wherein the plurality of disabling loop coils are positioned around at least one of the end rings in a non-overlapping arrangement to one another and having a combined total length of a circumference of one of the end rings.

22. A magnetic resonance coil in accordance with claim 19 wherein the plurality of disabling loop coils extending beyond and outside of the extent of the one end ring are curved and positioned along the end rings in a direction perpendicular to the conductors of the RF birdcage coil.

23. A magnetic resonance coil in accordance with claim 19 further comprising a plurality of capacitors in order to tune the plurality of disabling loop coils.

24. A magnetic resonance coil in accordance with claim 19 wherein the plurality of disabling loop coils comprise a pair of opposing loop coils on each end ring.

25. A method of disabling a magnetic resonance (MR) radio-frequency (RF) coil, the method comprising:

providing a plurality of disabling loop coils in combination with the MR RF coil, wherein the disabling loop coils are separate from and coupled to an end of the MR RF coil, without any circuit connections, between the plurality of the disabling loop coils, and the RF coil;

the plurality of disabling loop coils, extending beyond and outside of the extent of the end of the RF coil, and also being positioned along the end of the RF coil, in a non-overlapping arrangement to one another; and configuring the plurality of disabling loop coils in order to operate at a resonant frequency of the MR RF coil and in order to disable the MR RF coil.

* * * * *